(12) United States Patent
Flachowsky et al.

(10) Patent No.: US 9,012,956 B2
(45) Date of Patent: Apr. 21, 2015

(54) CHANNEL SIGE REMOVAL FROM PFET SOURCE/DRAIN REGION FOR IMPROVED SILICIDE FORMATION IN HKMG TECHNOLOGIES WITHOUT EMBEDDED SIGE

(71) Applicant: GLOBALFOUNDRIES Inc., Grand Cayman (KY)

(72) Inventors: Stefan Flachowsky, Dresden (DE); Ralf Richter, Radebeul (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 16 days.

(21) Appl. No.: 13/783,517

(22) Filed: Mar. 4, 2013

(65) Prior Publication Data

US 2014/0246698 A1 Sep. 4, 2014

(51) Int. Cl.
*H01L 21/8234* (2006.01)
*H01L 29/66* (2006.01)
*H01L 29/78* (2006.01)
*H01L 21/8238* (2006.01)

(52) U.S. Cl.
CPC .. *H01L 21/823418* (2013.01); *H01L 29/66431* (2013.01); *H01L 29/78* (2013.01); *H01L 21/823807* (2013.01); *H01L 29/7833* (2013.01); *H01L 29/66575* (2013.01); *H01L 29/7848* (2013.01); *H01L 21/823412* (2013.01)

(58) Field of Classification Search
CPC ............. H01L 21/02532; H01L 21/823412; H01L 21/823418; H01L 21/823814; H01L 29/66515; H01L 29/66575; H01L 29/7843; H01L 29/7848; H01L 29/7849; H01L 29/1054; H01L 29/7842; H01L 29/7833; H01L 21/823807
See application file for complete search history.

(56) References Cited

U.S. PATENT DOCUMENTS

| | | | | |
|---|---|---|---|---|
| 7,057,216 B2* | 6/2006 | Ouyang et al. | ................. | 257/194 |
| 7,238,555 B2* | 7/2007 | Orlowski et al. | ............ | 438/151 |
| 7,649,233 B2* | 1/2010 | Wang et al. | ................... | 257/396 |
| 7,741,167 B2* | 6/2010 | Beyer et al. | ..................... | 438/199 |
| 7,893,503 B2* | 2/2011 | Beyer et al. | ..................... | 257/369 |
| 8,338,892 B2* | 12/2012 | Kronholz et al. | ............ | 257/368 |
| 2007/0296027 A1* | 12/2007 | Yang et al. | ..................... | 257/327 |
| 2010/0221883 A1* | 9/2010 | Kronholz et al. | ............ | 438/285 |
| 2010/0252866 A1* | 10/2010 | Peidous et al. | ................ | 257/255 |
| 2011/0027952 A1* | 2/2011 | Kronholz et al. | ............ | 438/231 |

(Continued)

OTHER PUBLICATIONS

Borel et al, "Control of Selectivity between SiGe and Si in Isotropic Etching Processes," Japanese Journal of Applied Physics, vol. 43, No. 6B, 2004, pp. 3964-3966.*

*Primary Examiner* — Joseph C Nicely
(74) *Attorney, Agent, or Firm* — Amerson Law Firm, PLLC

(57) ABSTRACT

When forming sophisticated P-channel transistors, a semiconductor alloy layer is formed on the surface of the semiconductor layer including the transistor active region. When a metal silicide layer is formed contiguous to this semiconductor alloy layer, an agglomeration of the metal silicide layer into isolated clusters is observed. In order to solve this problem, the present invention proposes a method and a semiconductor device wherein the portion of the semiconductor alloy layer lying on the source and drain regions of the transistor is removed before formation of the metal silicide layer is performed. In this manner, the metal silicide layer is formed so as to be contiguous to the semiconductor layer, and not to the semiconductor alloy layer.

19 Claims, 9 Drawing Sheets

(56) References Cited

U.S. PATENT DOCUMENTS

| | | |
|---|---|---|
| 2012/0009751 A1* | 1/2012 | Kronholz et al. .............. 438/289 |
| 2012/0098067 A1* | 4/2012 | Yin et al. ...................... 257/351 |
| 2012/0156864 A1* | 6/2012 | Kronholz et al. .............. 438/492 |
| 2012/0161250 A1* | 6/2012 | Kronholz et al. .............. 257/407 |
| 2012/0164805 A1* | 6/2012 | Kronholz et al. .............. 438/276 |
| 2012/0235249 A1* | 9/2012 | Kronholz et al. .............. 257/402 |
| 2012/0241816 A1 | 9/2012 | Flachowsky et al. |
| 2012/0261725 A1 | 10/2012 | Flachowsky et al. |
| 2012/0267685 A1* | 10/2012 | Cheng et al. ................... 257/192 |
| 2012/0280277 A1* | 11/2012 | Scheiper et al. .............. 257/190 |
| 2012/0282760 A1* | 11/2012 | Kronholz et al. .............. 438/478 |
| 2012/0319207 A1* | 12/2012 | Iijima ........................... 257/369 |
| 2013/0040430 A1* | 2/2013 | Pal et al. ....................... 438/275 |
| 2013/0320449 A1* | 12/2013 | Hoentschel et al. ........... 257/368 |
| 2013/0320450 A1* | 12/2013 | Hoentschel et al. ........... 257/368 |
| 2014/0113419 A1* | 4/2014 | Scheiper et al. .............. 438/218 |
| 2014/0183654 A1* | 7/2014 | Hoentschel et al. ........... 257/369 |

\* cited by examiner

CHANNEL SIGE REMOVAL FROM PFET SOURCE/DRAIN REGION FOR IMPROVED SILICIDE FORMATION IN HKMG TECHNOLOGIES WITHOUT EMBEDDED SIGE

BACKGROUND OF THE INVENTION

1. Field of the Invention

Generally, the present disclosure relates to integrated circuits and, more particularly, to transistors comprising a silicon/germanium alloy layer deposited onto the surface of the active region of the transistor.

2. Description of the Related Art

The ongoing trend in electronics towards more and more complex integrated circuits requires the dimensions of electronic devices to decrease, in order to achieve a higher and higher integration density.

Transistors are the dominant circuit elements in current integrated circuits. Currently, several hundred millions of transistors may be provided in presently available complex integrated circuits, such as microprocessors, CPUs, storage chips and the like. It is then crucial that the typical dimensions of the transistors included in an integrated circuit have as small as possible typical dimensions, so as to enable a high integration density.

Among the various fabrication technologies of integrated circuits, the CMOS technology is currently the most promising approach, since it enables producing devices with superior characteristics in terms of operating speed, power consumption and cost efficiency. In CMOS circuits, complementary transistors, i.e., P-channel transistors and N-channel transistors, are used for forming circuit elements, such as inverters and other logic gates to design highly complex circuit assemblies. During the fabrication of complex integrated circuits using CMOS technology, millions of transistors, i.e., N-channel transistors and P-channel transistors, are formed in active regions defined within a semiconductor layer supported by a substrate.

Presently, the layer in which most integrated circuits are formed is made out of silicon, which may be provided in crystalline, polycrystalline or amorphous form. Other materials such as, for example, dopant atoms or ions may be introduced into the original semiconductor layer.

A MOS transistor or generally a field effect transistor, irrespective of whether an N-channel transistor or a P-channel transistor is considered, comprises a source and a drain region, highly doped with dopants of the same species. An inversely or weakly doped channel region is then arranged between the drain and the source regions. The conductivity of the channel region, i.e., the drive current capability of the conductive channel, may be controlled by a gate electrode formed in the vicinity of the channel region and separated therefrom by a thin insulating layer. The conductivity of the channel region depends on, among other things, the mobility of the charge carriers and on the distance along the transistor width direction between the source and drain regions, which is also referred to as channel length. For example, by reducing the channel length, the channel resistivity decreases. Thus, an increased switching speed and higher drive current capabilities of a transistor may be achieved by decreasing the transistor channel length.

However, reduction of transistor channel length may not be pushed to extreme limits without incurring other problems. For example, the capacitance between the gate electrode and the channel decreases with decreasing channel length. This effect must then be compensated for by reducing the thickness of the insulating layer between the gate and the channel. For example, for a gate length of approximately 80 nm, a gate dielectric material based on silicon dioxide with a thickness of less than 2 nm may be required in high speed transistor elements. Such small thicknesses of the insulating layer might, however, result in increased leakage currents caused by hot carrier injection and direct tunneling of charge carriers through the extremely thin gate dielectric material. Since a further reduction in thickness of silicon dioxide-based gate dielectric materials may increasingly become incompatible with thermal power requirements of sophisticated integrated circuits, other alternatives have been developed in order to increase the charge carrier mobility in the channel region, thereby also enhancing overall performance of field effect transistors.

One promising approach in this respect is the generation of a certain type of strain in the channel region, since the charge carrier mobility in silicon strongly depends on the strain conditions of the crystalline material. For example, for a standard crystallographic configuration of the silicon-based channel region, a compressive strain component in a P-channel transistor may result in a superior mobility of holes, thereby increasing switching speed and drive current of P-channel transistors.

In silicon-based transistors, a semiconductor alloy with the same crystal structure as silicon but with a slightly greater lattice constant may be used for applying a desired amount of compressive stress in the channel region of a PFET transistor. For example, a silicon/germanium (SiGe) alloy with a variable concentration of germanium (Ge) may be used.

SiGe or other semiconductor alloys may be used for fabricating improved P-channel FETs in two different ways.

One method consists of embedding the semiconductor alloy in the active region at the ends of the channel region. For example, after forming the gate electrode structure, corresponding cavities may be formed laterally adjacent to the gate electrode structure in the active region. The cavities thus formed may then be filled with the silicon/germanium alloy which, when grown on the silicon material, generally experiences an internal compressive strain. This strain may then induce a corresponding compressive strain component in the adjacent channel region. Consequently, a plurality of process strategies has been developed in the past in order to incorporate a highly strained silicon/germanium material in the drain and source areas of P-channel transistors. A silicon/germanium or, in general, a semiconductor alloy material used in the manner described above will hereinafter be referred to as "embedded SiGe" or "embedded semiconductor alloy," respectively.

Alternatively or additionally, a thin SiGe layer may be deposited directly onto a single crystal silicon layer so as to form an SiGe channel for the PFET. Semiconductor alloy layer is mainly provided for modulating the work function of the P-channel FET. Due to the lattice mismatch between crystalline Si and SiGe, the thin SiGe layer grown on the Si surface is highly strained, which increases hole mobility in the semiconductor alloy layer. According to some fabrication techniques, a thin SiGe layer in the channel region is necessary in order to modulate the work function of the P-channel FET. This is the case, for example, with the implementation according to the gate-first high-k/metal gate procedure, especially with gate electrodes of a length of 32 nm or smaller. An SiGe or, in general, a semiconductor alloy layer formed as described above will hereinafter be referred to as "channel SiGe layer" or "channel semiconductor alloy layer," respectively.

The known problem when using a semiconductor alloy, such as SiGe, during PFET fabrication is related to the formation of a "spotty," i.e., non-continuous, layer of metal silicide in correspondence to the portions of the semiconductor structure surface exposing SiGe.

A metal silicide layer, preferably nickel silicide (NiSi), is formed on the surface portions of the semiconductor structure which are to be electrically contacted in order to reduce the sheet resistance of silicon contact regions. However, when formed in correspondence to surface areas exposing SiGe, the silicide layer has been observed to agglomerate and cluster due to the thermal budget undergone by the semiconductor structure during subsequent stages of the device fabrication process flow. In particular, as will be clarified in the following, the SiNi layer forming an interface with SiGe tends to agglomerate into isolated clusters during heating steps performed at a temperature in the range of 400-500° C. after formation of the SiNi layer and/or after formation of a stressed material layer on top of the exposed face of the semiconductor structure.

FIG. 1a shows the formation of a spotty SiNi layer in a typical PFET including a channel SiGe layer as produced by following the teachings of the prior art.

FIG. 1a schematically illustrates a cross-sectional view of a semiconductor structure 100 in an advanced manufacturing stage. As shown, the device 100 comprises a substrate 101, such as a semiconductor material and the like, above which a semiconductor layer 102 is formed. The semiconductor layer 102 is typically made of a silicon single crystal. The semiconductor layer 102 is laterally divided into a plurality of active regions 102a, which are to be understood as semiconductor regions in and above which one or more transistors are to be formed. For convenience, a single active region 102a is illustrated, which is laterally delimited by an isolation region 102b, such as a shallow trench isolation. Depending on the overall device requirements, the substrate 101 and the semiconductor layer 102, for instance initially provided as a silicon material, may form an SOI (silicon-on-insulator) architecture when a buried insulating material (not shown) is formed directly below the semiconductor layer 102. In other cases, initially the semiconductor layer 102 represents a part of the crystalline material of the substrate 101 when a bulk configuration is to be used for the device 100.

The semiconductor structure 100 includes a P-channel FET 150 formed in and above the active region 102a. The transistor 150 includes highly doped drain and source regions 151 formed in the active region 102a. Drain and source regions 151 also include extension regions 151e, which are regions determining the length of the channel region 155.

A semiconductor alloy layer 104, typically an SiGe layer, lies on top of the upper surface 102u of the semiconductor layer 102. In particular, the SiGe layer 104 is formed on the upper surface 102u of the silicon layer 102 within active region 102a. The upper surface 102u of the semiconductor layer 102 may be indented in correspondence to active regions 102a in order to accommodate the SiGe layer 104, as shown in FIG. 1a. The semiconductor alloy layer 104 is formed on the silicon upper surface 102u so that a portion thereof is included in the transistor channel region 155, thus forming a part thereof. Thus, the semiconductor alloy 104 is a channel semiconductor alloy layer.

The transistor 150 further includes a gate electrode structure 160 formed on the channel semiconductor alloy layer 104 and, in particular, on its upper or exposed surface 104u. The gate electrode 160 may have any appropriate geometric configuration, for instance in terms of length and width. For example, the gate length, i.e., in FIG. 1a, the horizontal extension of an electrode material 162 of the gate electrode structure 160, may be 50 nm and less. An insulation layer 161 physically and electrically separates the gate electrode material 162 from the channel region 155 of the transistor 150.

Depending on the configuration of the gate electrode structure 160, the insulation layer 161 and gate electrode material 162 may be formed in different ways. For example, if the gate electrode 160 is a conventional oxide/polysilicon gate electrode (polySiON), then the gate insulation layer 161 may be formed from a conventional gate dielectric material, such as, for example, silicon dioxide, silicon oxynitride and the like, whereas the gate electrode material 162 may comprise polysilicon. Alternatively, a high-k dielectric/metal gate electrode (HKMG) configuration may be preferred for the gate electrode structure 160. In this case, the insulation layer 161 may be one of the high-k gate dielectric materials well known in the art. By high-k material it is referred to a material with a dielectric constant "k" higher than 10. Examples of high-k materials used as insulating layers in gate electrodes are tantalum oxide ($Ta_2O_5$), strontium titanium oxide ($SrTiO_3$), hafnium oxide ($HfO_2$), hafnium silicon oxide (HfSiO), zirconium oxide ($ZrO_2$) and the like.

The gate electrode structure 160 may also have a gate metal layer 162a, for instance in the form of tantalum nitride and the like, possibly in combination with a work function metal species, such as aluminum and the like. The gate metal layer 162a is typically formed above the insulation layer 161, thereby adjusting an appropriate work function and thus threshold voltage of the transistor 150. Furthermore, the gate electrode structure 160 may be laterally delimited by a spacer structure 163 which may include one or more dielectric materials such as, for example, silicon nitride, silicon dioxide, silicon oxynitride and the like. For example, the structure 163 may include appropriate protective liner materials for laterally encapsulating sensitive gate materials, such as the insulation layer 161 and, in particular, the metal layer 162a.

FIG. 1b shows semiconductor structure 100 in a subsequent stage of the fabrication process flow, wherein a refractory metal layer 108 is deposited onto the exposed face of the semiconductor structure. In particular, the refractory metal layer 108 is deposited onto the upper surface 104u of the semiconductor alloy layer 104 using a suitable material deposition process, such as chemical vapor deposition (CVD), physical vapor deposition (PVD) and the like. The layer 108 includes one or more refractory metals which are adapted to form a metal silicide layer in correspondence to portions of the semiconductor structure exposing the gate electrode material 162 and source or drain regions 151. Thus, the refractory metal layer 108 may comprise, for example, one metal such as nickel, titanium, cobalt and the like. Preferably, the refractory metal layer 108 comprises nickel. The refractory metal layer 108 may also comprise platinum, which in some cases may promote a more homogeneous formation of nickel monosilicide.

After deposition of the refractory metal layer 108, a heat treatment process 180 may be performed so as to initiate a chemical reaction between the nickel atoms in the layer 108 and the silicon atoms in those areas of the source and drain regions 151 and the gate electrode material 162 that are in contact with the nickel, thereby forming nickel silicide regions that substantially comprise low-resistivity nickel monosilicide. The heat treatment process 180 is generally a two-step process. A first heat treatment step is performed in the range of approximately 300-400° C. for a time period of approximately 30-90 seconds. After the first heat treatment step, any non-reacted nickel material from the refractory metal layer 108 is selectively removed by one of a variety of well-known etch/cleaning processes. Finally, a second heat treatment step is performed in the range of approximately 400-500° C., again for a time period of approximately 30-90 seconds. It should be noted that the silicon material contained in the sidewall spacer structures 163 and the isolation regions 102b does not substantially take part in the chemical reaction induced during the heat treatment process 180, as it is present in those features only as a thermally stable silicon dioxide and/or silicon nitride material.

In FIG. 1c, the semiconductor structure 100 is shown after the deposition of the refractory metal layer 108 and application of heat treatment 180. As a result of the heat treatment 180, a metal silicide layer 162b has formed partly in and partly on top of the upper surface of the gate electrode material 162, which was exposed before depositing the refractory metal layer 108. Analogously, a metal silicide layer 153 has formed partly in semiconductor alloy layer 104 and partly on top of the upper surface 104u thereof, which was exposed before depositing the refractory metal layer 108.

As shown in FIG. 1d, after formation of metal silicide layers, preferably nickel silicide layers 162b and 153, a stressed material layer 121 is deposited onto the exposed face of the semiconductor structure 100 by using a well-known deposition technique such as, for example, plasma-enhanced chemical vapor deposition (PECVD). For example, the deposition of the stressed material layer 121 may be performed under a pressure that is in the range of about 300-1200 mTorr, at a temperature between about 400-500° C.

The stressed material layer 121 comprises a dielectric material, typically silicon nitride (SiN), having an etch selectivity to a dielectric material layer 120 formed above the semiconductor structure 100 during a later manufacturing stage (see, e.g., FIG. 1e). Thus, the stressed material layer 121 also acts as an etch stop layer.

After deposition of the stressed material layer 121, a UV curing process 182 is applied to the semiconductor structure 100 in order to increase the tensile stress of the silicon nitride stressed material layer 121, thus further enhancing the overall speed and performance of the transistor element 150. UV cure 182 is typically performed at a temperature in the range of about 400-500° C.

It has been observed that, mainly as a result of the deposition of the stressed material layer 121 and of UV cure 182, nickel silicide layer 153 forming an interface with SiGe layer 104 in correspondence to the source or drain regions 151 tends to agglomerate into isolated clusters, thus forming holes or voids 153a between neighboring clusters. Thus, the SiGe layer 104 in the source or drain regions 151 forms an interface with the SiN stressed material layer 121 through holes 153a in the nickel silicide layer 153.

Thus, metal silicide layer 153 tends to agglomerate, forming isolated clusters during the fabrication steps performed at a temperature between about 400-500° C. after the formation of metal silicide layer 153.

The presence of a "spotty," i.e., a clustered, non-continuous metal silicide layer 153 on top of the source and drain regions 151 is highly undesirable during fabrication of the semiconductor structure 100. Since the metal silicide 153 is specifically provided so as to reduce the contact resistance of the transistor 150, the presence of a spotty silicide layer may generally reduce the overall conductivity. Furthermore, a possible negative consequence of the presence of holes 153a in the metal silicide layer 153 is illustrated in FIG. 1e, which schematically illustrates a fabrication process step subsequent to that shown in FIG. 1d.

An interlayer dielectric material layer 120 is deposited onto the stressed material layer 121. The dielectric layer 120, which may comprise any suitable dielectric material such as, for example, silicon dioxide ($SiO_2$), is generally deposited as a continuous layer. Thereafter, an etching process 184, such as reactive ion etching (RIE), is performed on the semiconductor structure 100. Etching 184 may be performed after placing an appropriately patterned etching mask 122 on the surface of the structure 100. Etching 184 is performed in order to form via openings 124 and 126 exposing portions of the metal silicide layer 153 contacting the source and drain regions 151 and portions of the metal silicide layer 162b contacting gate electrode material 162, respectively. In particular, etching 184 may be performed in two subsequent steps. In the first step, portions of the dielectric layer 120 are removed by using a selective etching not affecting the stressed material layer 121. In the second step of etch process 184, the portions of the stressed material layer 121 at the bottom of openings 124 and 126 are removed so as to expose underlying portions of metal silicide layers 153 and 162b, respectively.

Due to the presence of the holes 153a in the metal silicide layer 153, during the second step of etching 184, via openings 124 may only partially align with the nickel silicide 153 in and on top of source and drain regions 151, thereby potentially leading to product defects. In particular, the second step of etch 184 might etch deeply into the active region 102a through holes 153a, thereby forming the channels 124pt in the source and/or drain region 151 of the transistor 150.

In a subsequent fabrication step, via openings 124 and 126 are filled with a high electrical conductivity metal such as tungsten. If channels 124pt have been formed during etch 184, they are also filled with tungsten, thus forming a so-called contact "punch through," i.e., a metallic contact extending within the inside of the source or drain regions 151. Contact "punch throughs" significantly alter the characteristics of the transistor 150, since they may even result in a complete shorting of PN junctions and shortings of adjacent contact elements via the well region of different transistors.

Thus, it is desirable that the metal silicide layer 153 contacting the source and drain regions 151 is continuous and free of holes or cut-out portions.

It has been recognized that the presence of the holes 153a is strongly correlated with the high germanium concentration within the material 153. This hypothesis follows from the observation that metal silicide 153 formed in and on top of source and drain regions 151 and, thus, forming an interface with SiGe layer 104, tends to agglomerate into clusters upon any heating treatment performed at a temperature above about 400° C. after formation of metal silicide 153. By contrast, nickel silicide agglomeration does not occur under deposition of the stressed material layer 121 or exposure to the UV cure 182 in the nickel silicide layer 162b in the upper portion of the gate electrode 160, which is comprised substantially of polysilicon material 162. Accordingly, it is believed that nickel silicide agglomeration may possibly be caused by the presence of germanium, which may tend to "destabilize" the microstructure under exposure to UV light or heating at high temperatures, thereby allowing some degree of nickel silicide and/or silicon/germanium material diffusion to occur.

Avoiding any process with elevated temperatures after incorporating the metal silicide 153 may result in inferior device characteristics and may also significantly restrict the overall flexibility in designing the manufacturing flow for fabricating complex semiconductor devices. Similarly, reducing the germanium concentration is also less than desirable, even if a corresponding reduction in germanium concentration would be restricted to an upper portion of the material 153 since, in particular in highly scaled devices, nevertheless, a pronounced reduction of the overall strain in the channel region 155 may be observed, thereby also reducing overall performance of the transistor 150.

Solutions to these problems have been proposed in the case of P-channel FETs including embedded SiGe, i.e., a semiconductor alloy portion embedded in the active regions at the ends of the channel region, as defined above. Solutions include use of a "cap" layer with a smaller germanium concentration. Other solutions propose to implant impurity ions, such as carbon and nitrogen ions, within a surface portion of the embedded SiGe wherein the nickel silicide layer is later to be formed. This latter approach has been proposed, for example, in U.S. patent applications published as US 2012/0241816 A1 and US 2012/0261725 A1.

However, no approach has been proposed so far for P-channel FETs including a channel semiconductor alloy layer on top of a crystalline silicon active region but no embedded semiconductor alloy. Such P-channel FETs may be, for example, fabricated according to the gate-first HKMG approach.

Thus, an object of the present invention is to provide an improved fabrication method for P-channel FETs having a channel SiGe layer but no embedded SiGe, which is able to alleviate or minimize the drawbacks and problems set forth above. In particular, the present invention proposes a method of fabricating a P-channel FET having a channel SiGe layer and no embedded SiGe, which prevents the metal silicide layer contacting the source and drain regions from agglomerating during the fabrication process flow.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present invention is based on the inventive idea that the fabrication method of a P-channel FET transistor including a channel SiGe layer and, preferably, no embedded SiGe layer may be improved by removing the portion of channel SiGe layer not lying below the gate electrode and, in particular, the portion of channel SiGe layer lying on top of the source and drain regions of the FET before inducing the formation of a metal silicide layer contacting the source and drain regions of the FET. Thus a method of forming a semiconductor structure adapted to be formed as a P-channel FET is proposed. The method includes forming a semiconductor layer having at least one active region, the semiconductor layer having an upper surface, depositing a semiconductor alloy layer onto the upper surface of the semiconductor layer, forming a gate electrode structure onto the semiconductor alloy layer, removing one or more predetermined portions of the semiconductor alloy layer, so as to expose one or more surface portions of the semiconductor layer, and forming a metal silicide layer forming an interface with the semiconductor layer after the step of removing the one or more predetermined portions of the semiconductor alloy layer.

According to an embodiment of the present invention, the portion of channel SiGe layer lying on the source or drain regions is removed after the formation of the gate electrode stack and before at least a part of the formation process of the drain and source regions.

According to a further embodiment of the present invention, the portion of channel SiGe layer lying on the source or drain regions is removed after the formation of the drain and source regions and their activation by heating and before the metal silicide layer formation.

BRIEF DESCRIPTION OF THE DRAWINGS

The disclosure may be understood by reference to the following description taken in conjunction with the accompanying drawings, in which like reference numerals identify like elements, and in which.

Figure 1A:
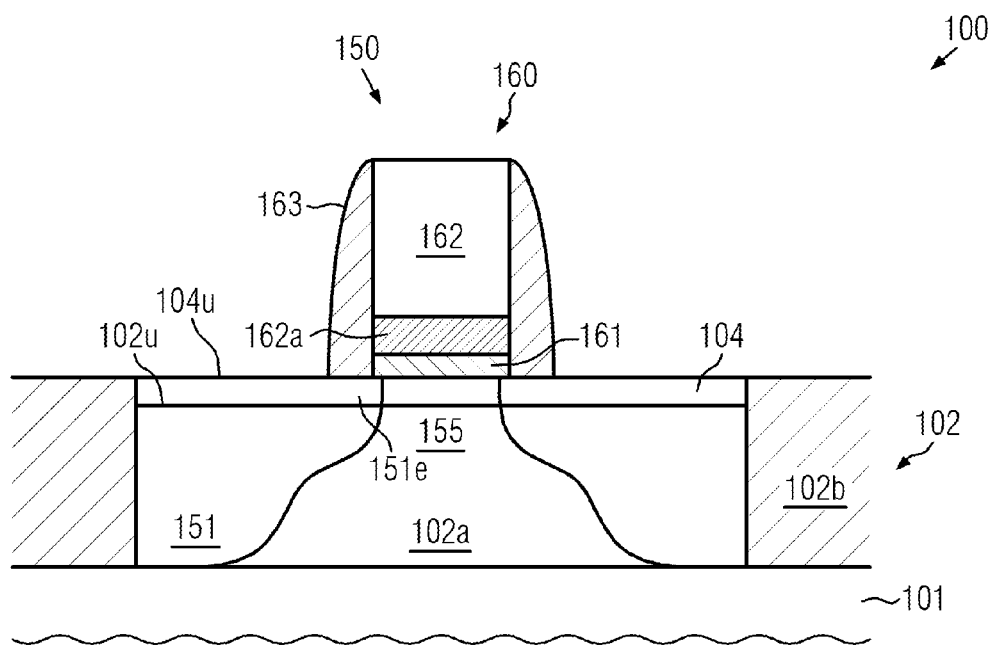
FIGS. 1a-1e schematically illustrate the cross-sectional views of a semiconductor structure comprising a P-channel transistor during subsequent stages of a fabrication process flow according to the prior art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

It should be noted that, where appropriate, the reference numbers used in describing the various elements illustrated in FIGS. 2a-2g and in FIGS. 3a-3d substantially correspond to the reference numbers used in describing the corresponding elements illustrated in FIGS. 1a-1e above, except that the leading numeral for corresponding features has been changed from a "1" to a "2," or from a "1" to a "3." For example, semiconductor device "100" corresponds to semiconductor devices "200" and "300," gate insulation layer "161" corresponds to gate insulation layers "261" and "361," gate electrode "160" corresponds to gate electrodes "260" and "360", and so on. Accordingly, the reference number designations used to identify some elements of the presently disclosed subject matter may be illustrated in FIGS. 2a-2g and/or FIGS. 3a-3d, but may not be specifically described in the following disclosure. In those instances, it should be understood that the numbered elements shown in FIGS. 2a-2g and/or FIGS. 3a-3d which are not described in detail below substantially correspond with their like-numbered counterparts illustrated in FIGS. 1a-1e, and described in the associated disclosure set forth above.

Analogously, reference numbers used in FIGS. 3a-3d substantially correspond to the reference numbers used in describing the corresponding elements illustrated in FIGS. 2a-2g except that the leading numeral has been changed from a "2" to a "3". For example, semiconductor alloy layer "304" in FIGS. 3a-3d corresponds to semiconductor alloy layer "204" in FIGS. 2a-2g, metal silicide layer 353 in FIG. 3d corresponds to metal silicide layer 253 in FIGS. 2e-2g, etch 372 in FIG. 3c corresponds to etch 272 in FIG. 2c.

Furthermore, it should be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal" and the like—should be construed in light of that term's normal and everyday meaning relative to the depiction of the components or elements in the referenced figures. For example, referring to the schematic cross-section of the semiconductor device 200 depicted in FIG. 2b, it should be understood that the gate electrode structure 260 is formed "above" the active region 202a and the semiconductor alloy layer 204 and that the semiconductor layer 202 is "below" or "under" the semiconductor alloy layer 204. Similarly, it should also be noted that sidewall spacer structures 263 are positioned "adjacent to" the sidewalls of the gate electrode material 262, whereas, in special cases, the spacer structures 263 may be positioned "on" the sidewalls of the gate electrode material 262 in those embodiments wherein no other layers or structures are interposed therebetween.

FIGS. 2a-2g show a semiconductor structure 200 and a method of fabrication thereof according to a first embodiment of the present invention.

Figure 1B:
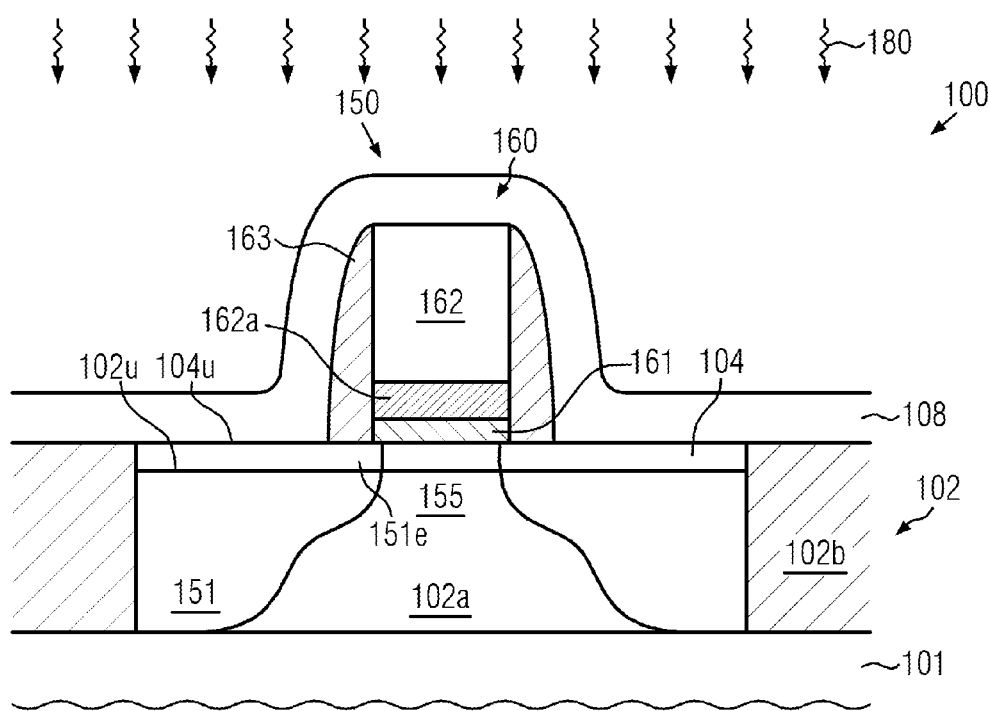
Figure 1C:
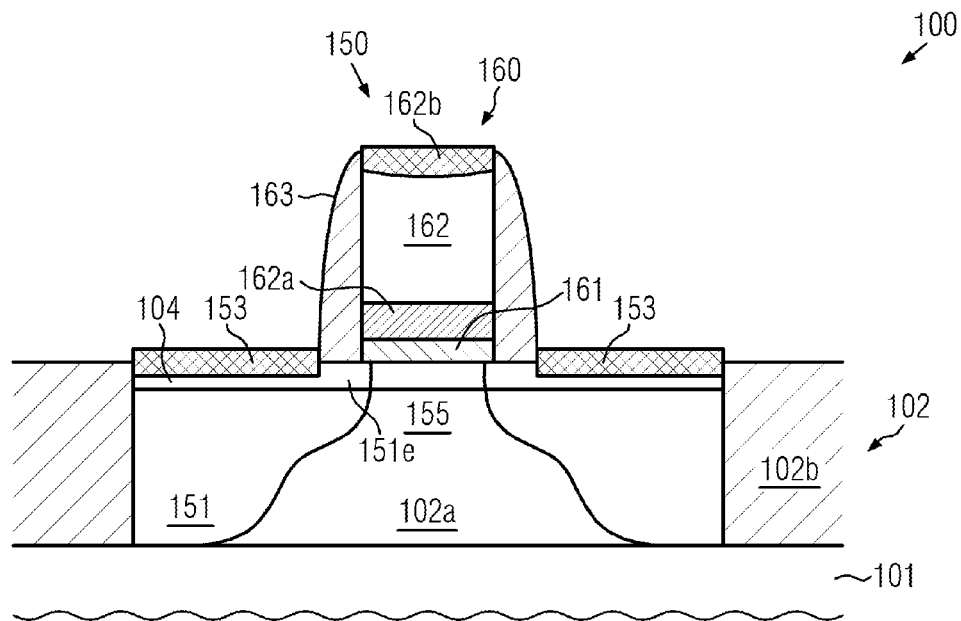
Figure 1D:
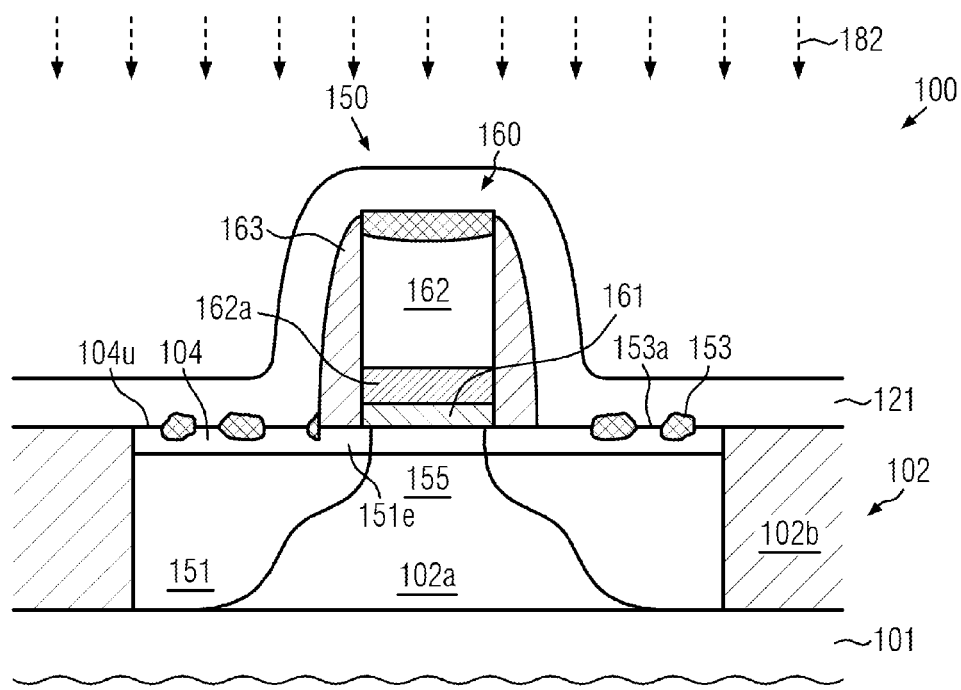
Figure 1E:
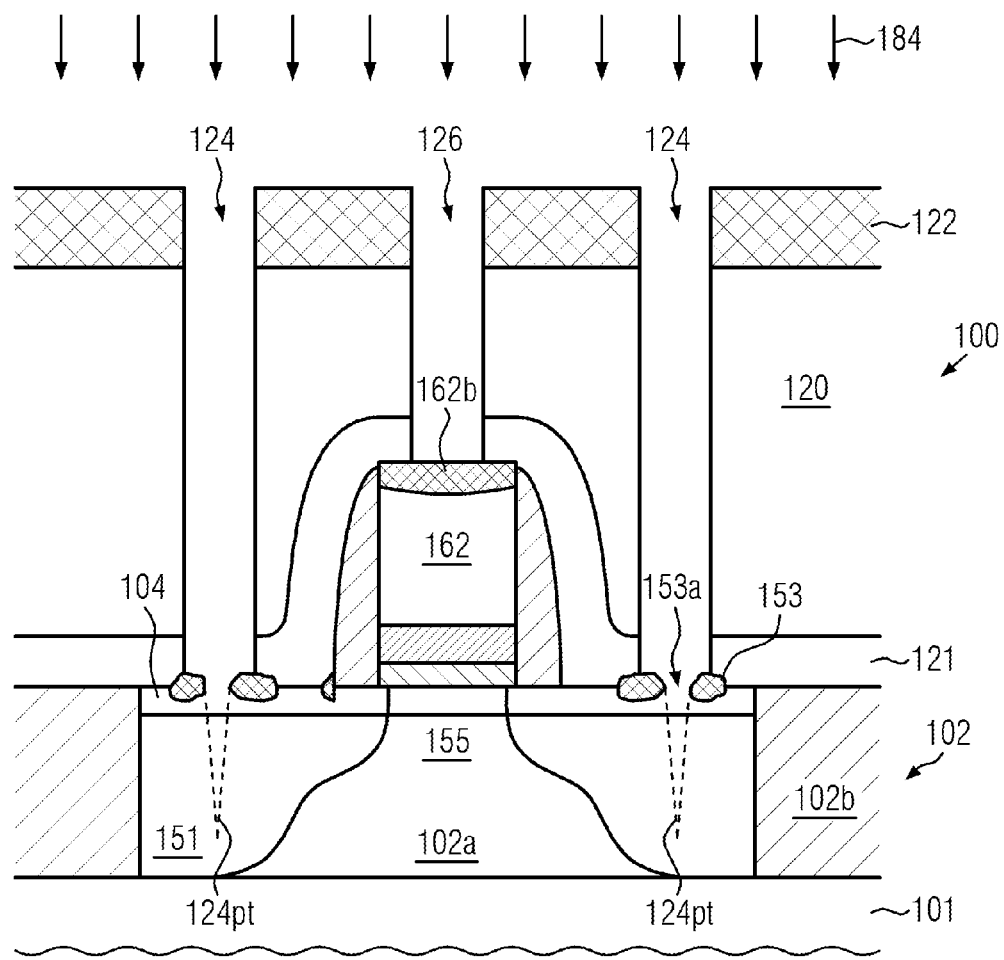
Figure 2A:
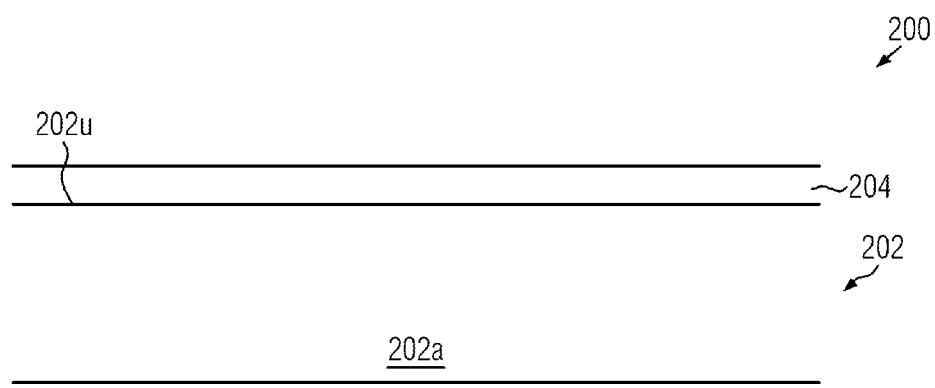
FIGS. 2a-2g schematically illustrate cross-sectional views of a semiconductor structure during subsequent manufacturing stages according to an embodiment of the method according to the present invention.

FIG. 2a shows semiconductor structure 200 during an early fabrication stage. A semiconductor layer 202 is shown, wherein an active region 202a has been created. Although not shown, it is understood that the semiconductor structure 200 may be formed on a substrate, as explained above with reference to FIGS. 1a-1e. As indicated with reference to the device 100, the substrate, which may represent any appropriate carrier material, and the semiconductor layer 202 may form an SOI configuration or a bulk configuration, depending on the overall process and device requirements. Furthermore, a plurality of active regions may be laterally delineated by isolation regions. For convenience, a single active region 202a is illustrated in FIG. 2a. In the embodiment shown, the active region 202a may correspond to the active region of a P-channel transistor to be formed in and above the active region 202a.

In one embodiment, the semiconductor layer 202 comprises silicon. In a specific embodiment, the semiconductor layer 202 comprises monocrystalline silicon.

The semiconductor layer 202 has an upper surface 202u, upon which a channel semiconductor alloy layer 204 is formed by means of any suitable layer deposition technique. The semiconductor alloy layer 204 is mainly provided for modulating the work function of the P-channel FET, thus adjusting its threshold voltage, as discussed above. The channel semiconductor alloy layer 204 is necessary, in particular, when implementing the P-channel FET using the gate-first HKMG technique with the FET channel region having a length of 32 nm or smaller.

Preferably, the semiconductor alloy layer 204 comprises a silicon/germanium (SiGe) alloy with a germanium concentration between 10-30%. The semiconductor alloy layer 204 may have a thickness in the range of 5-50 nm and, preferably, in the range of 6-10 nm.

Figure 2B:
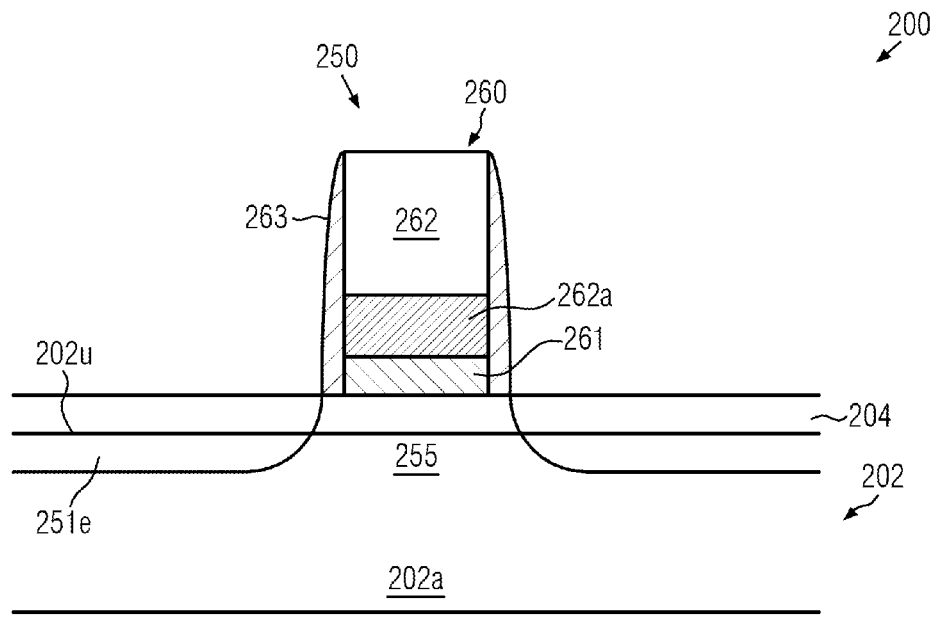

After depositing the semiconductor alloy layer 204, a gate electrode structure 260 is formed on the semiconductor alloy layer 204, as shown in FIG. 2b. The gate electrode structure 260 includes a gate electrode material 262, which may comprise silicon, for example, polycrystalline silicon. Furthermore, the gate electrode structure 260 is provided with a dielectric insulation layer 261 between the gate electrode material 262 and the channel region 255 of the transistor in the active region 202a of the semiconductor layer 202. As discussed above with reference FIG. 1a, the gate electrode structure 260 may be a conventional oxide/polysilicon gate electrode. Preferably, the gate electrode structure 260 may be formed according to an HKMG configuration and, in particular, according to a gate-first HKMG technique. In such embodiments, the gate electrode structure 260 may also include a gate metal layer 262a formed above the dielectric insulation layer 261, e.g., similar to the gate metal layer 162a described with respect to FIGS. 1a-1e above.

After forming the gate electrode structure 260, one or more implantation processes may be performed so as to form highly doped extension regions 251e of the source or drain regions, as shown in FIG. 2b. Thus, the channel region 255 of transistor 250 is defined.

Since the gate electrode structure 260 is formed after the semiconductor alloy layer 204 has been deposited onto the upper surface 202u of the semiconductor layer 202, a portion of the semiconductor alloy layer 204 lies below or under the gate electrode structure 260, whereas the remaining portion of the semiconductor alloy layer 204 remains exposed at the surface of the semiconductor structure 200. Thus, if a refractory metal layer were deposited onto the exposed surface of the structure 200 as schematically represented in FIG. 1b, the metal layer would partly form an interface with the semiconductor alloy layer 204. Consequently, the silicidation process described above would result in the formation of a spotty metal silicide, e.g., of a spotty nickel silicide layer.

In order to avoid the formation of a spotty nickel silicide layer in correspondence to the transistor source and drain regions, the present invention proposes to remove all exposed portions of the channel semiconductor alloy layer 204. In other words, the present invention proposes to remove all portions of the semiconductor alloy layer 204 which do not lie under the gate electrode structure 260 and are not screened thereby.

Figure 2C:
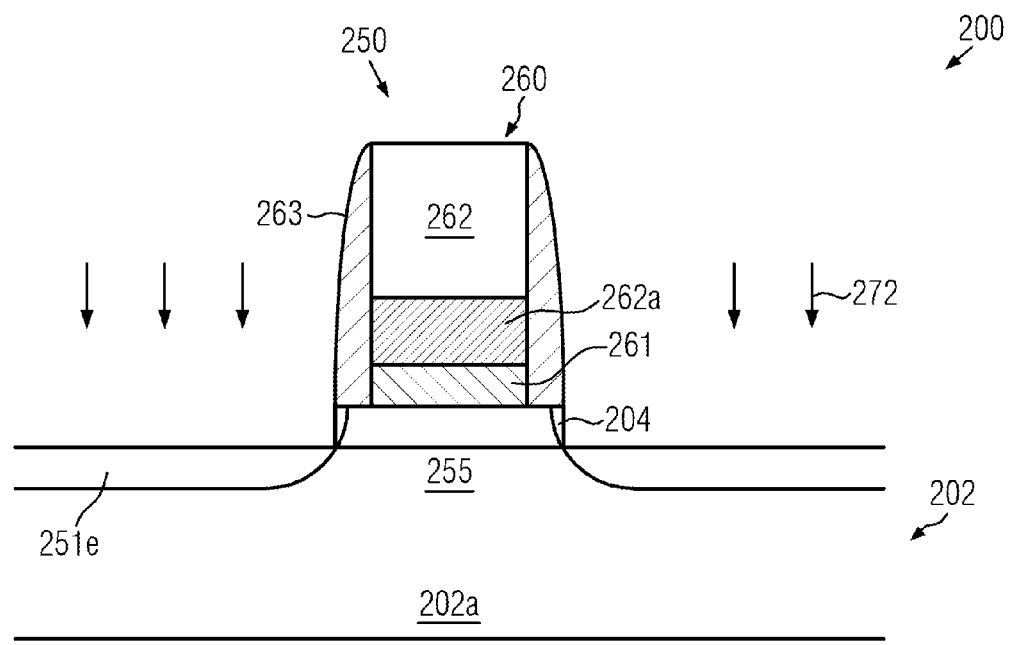

As shown in FIG. 2c, the method according to an embodiment of the present invention proposes to apply an etch 272 to the surface of the semiconductor structure 200 after formation of the gate electrode 260 so as to remove all portions of the semiconductor alloy layer 204 not lying below the gate electrode 260. Before applying etch 272, spacers 263 may be slightly expanded laterally. In particular, if a portion of the semiconductor alloy layer 204 has been implanted with suitable impurities so as to form extension regions 251e, spacers 263 may be broadened so that the gate electrode 260 extends over a portion of the extension regions 251 included in the semiconductor alloy layer 204.

Etch 272 is preferably an isotropic etch which may be performed by means of well-established techniques such as, for example, RIE. The parameters of etch 272 may be adjusted so that the thickness of the removed surface layer of the semiconductor structure 200 is approximately equal to the thickness of the semiconductor alloy layer 204. In particular, according to an embodiment of the present invention, the parameters of etch 272 are adjusted so that a surface layer of a thickness between 6-10 nm is removed from the semiconductor structure 200. Thus, the semiconductor alloy layer 204 is removed by etch 272 in correspondence to all its portions not lying under and being screened by the gate electrode 260, whereas the semiconductor layer 202 is substantially unaffected by etch 272, except at most for a thin surface layer not thicker than about 1 nm. In particular, all portions of the semiconductor alloy layer 204 lying on top of extension regions 251e are removed by etch 272.

As a result of etch 272, a surface portion of the semiconductor layer 202 is exposed. It should be appreciated that, due to the adjustment of the parameters of etch 272, the surface exposed is ideally the same original upper surface 202u of the semiconductor layer 202 onto which the semiconductor alloy layer 204 has been previously deposited. However, due to the tolerance with etching parameters, etch 272 might remove a thin surface layer of original semiconductor layer 202 and, thus, also original upper surface 202u. In any case, well-established etch processes are accurate enough that the surface of the semiconductor layer 202 exposed by etch 272 is at most at a distance of about 1 nm from the original upper surface 202u of semiconductor layer 202.

After performing etch 272, the fabrication process flow continues in a conventional manner.

Figure 2D:
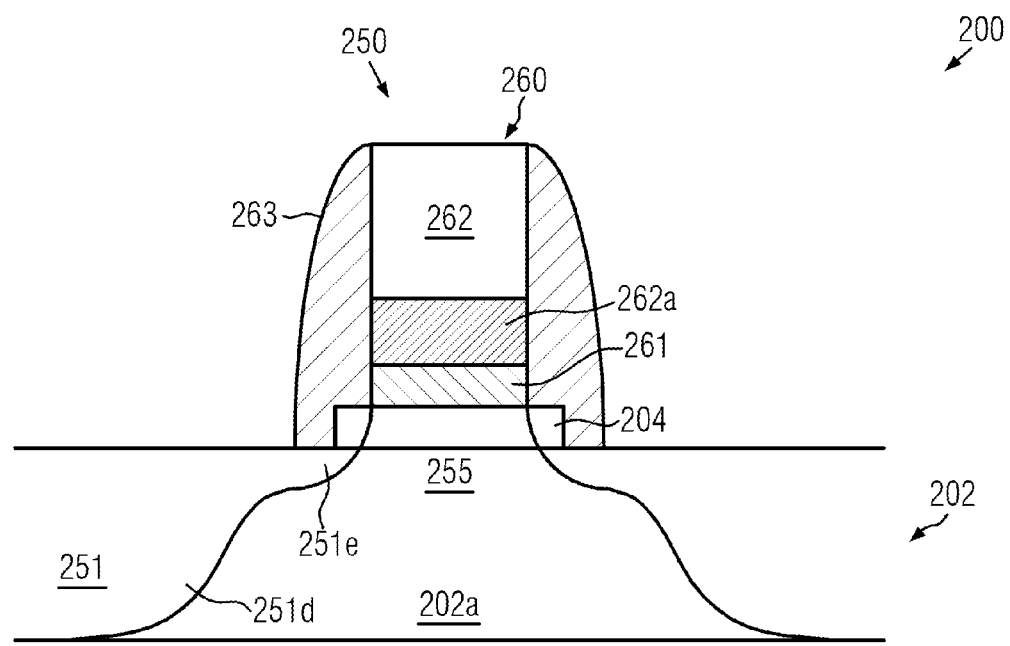
Figure 2E:
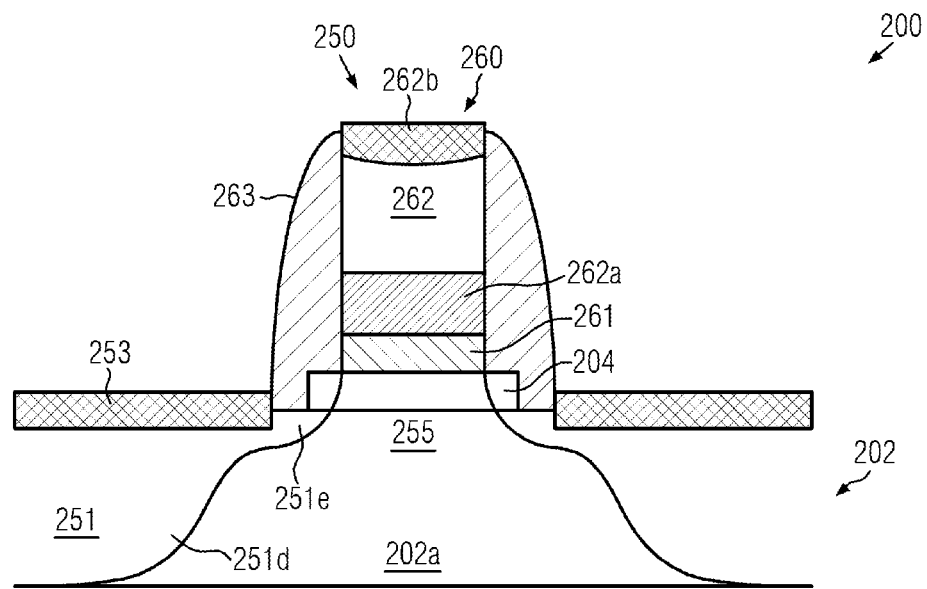

As shown in FIG. 2d, after performing etch 272, the formation of source and drain regions 251 may be completed or performed. In particular, deep regions 251d of source and drain regions 251 may be formed in the active region 202a of the semiconductor layer 202. Before forming deep regions 251d, the spacer structure 263 may be further broadened so as to comply with the overall process and device requirements. The drain and source regions 251 may be formed on the basis of any appropriate manufacturing strategy, for instance, by performing implantation processes so as to incorporate drain and source dopant species, possibly counter-doping species and the like. Thereafter, an appropriate anneal process may be applied so as to re-crystallize implantation-induced damage and activate the doping agents. A certain amount of diffusion of the doping species may likely result from application of the annealing process. FIG. 2e schematically shows the situation of the semiconductor structure 200 after the activating annealing has been performed.

After forming source and drain regions 252, the process flow continues with the deposition of a refractory metal layer (not shown) onto the surface of the semiconductor structure 200, as shown in FIG. 1b and described above with reference thereto. The refractory metal preferably comprises nickel.

It should be appreciated that, when the refractory metal is deposited onto the surface of the semiconductor structure 200 shown in FIG. 2d, the metal is deposited only onto surface portions exposing the semiconductor (e.g., silicon) of the semiconductor layer 202, the gate electrode material 262 (e.g., polycrystalline silicon) or the dielectric of the spacers 263. Thus, no portions of the refractory metal layer are deposited onto or form an interface with a semiconductor alloy such as SiGe.

After depositing the refractory metal layer, a silicidation process is applied similar to the heat treatment 180 shown in FIG. 1b and described with reference thereto. FIG. 2e shows the semiconductor structure 200 after the silicidation process. Due to the heat treatment applied, metal semiconductor layer 262b is formed on the upper edge of the gate electrode 260 and metal semiconductor layer 253 is formed in correspondence to the source/drain regions 251. Metal semiconductor layers 253 and 262b are preferably nickel silicide layers, although they may contain other species.

The metal silicide layer 253 may be formed partly in and/or partly on the semiconductor layer 202 so as to form one or more contact regions to the source and drain regions 251. The metal silicide layer 253 is adjacent to the semiconductor layer 202. Thus, the metal silicide layer 253 forms an interface with the semiconductor layer 202, which may be made of crystalline silicon. In particular, the metal silicide layer 253 is such that the only portions of the semiconductor structure 200 with which it forms an interface are the semiconductor layer 202 and a bottom surface portion of the spacers 263. The metal silicide layer 253 does not have any portions thereof forming an interface with a semiconductor alloy.

Since the metal semiconductor layer 253 is away and spatially separated from all portions of semiconductor structure containing SiGe and, in particular, from semiconductor alloy layer 204, the metal silicide layer 253 is free of germanium impurities inside. Thus, during the subsequent stages of the fabrication flow, the metal silicide layer 253 will not undergo the agglomeration process as described in relation to the process known from the prior art.

Figure 2F:
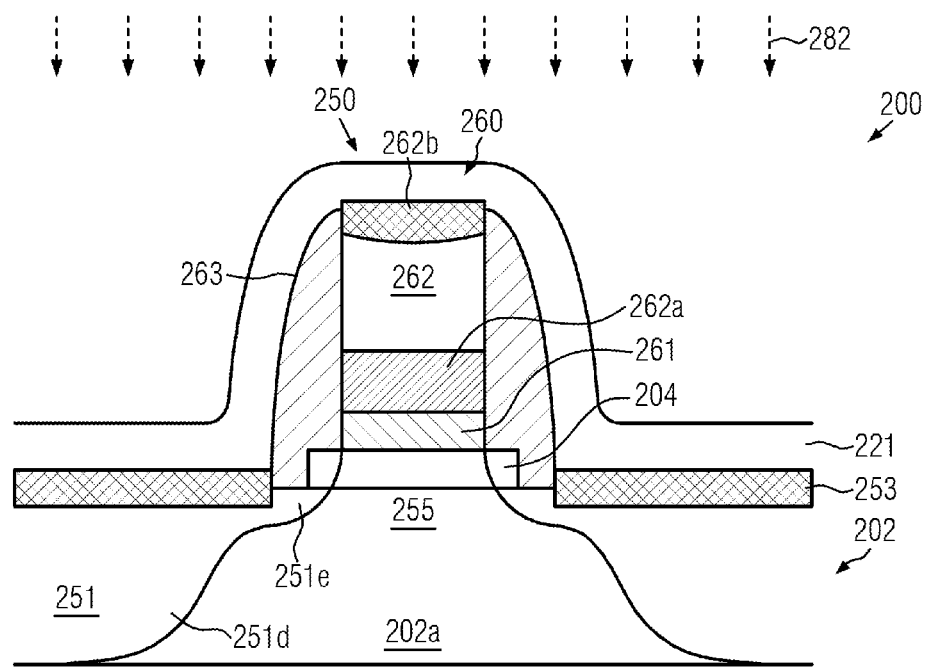

As shown in FIG. 2f, after formation of the silicide layers 253 and 262b, a stressed material layer 221 is deposited onto the surface of the semiconductor structure 200. Subsequently, a UV curing process 282 is applied at a temperature ranging from 400-500° C., as described above with reference to FIG. 1d. In contrast to the fabrication method known in the art, the metal silicide layer 253 contacting source and drain regions 251 does not agglomerate and does not result in a spotty layer upon deposition of the stressed material layer 221 and application of UV cure 282. This mainly occurs since no germanium, or a negligible concentration thereof, is present in the metal silicide layer 253.

Figure 2G:
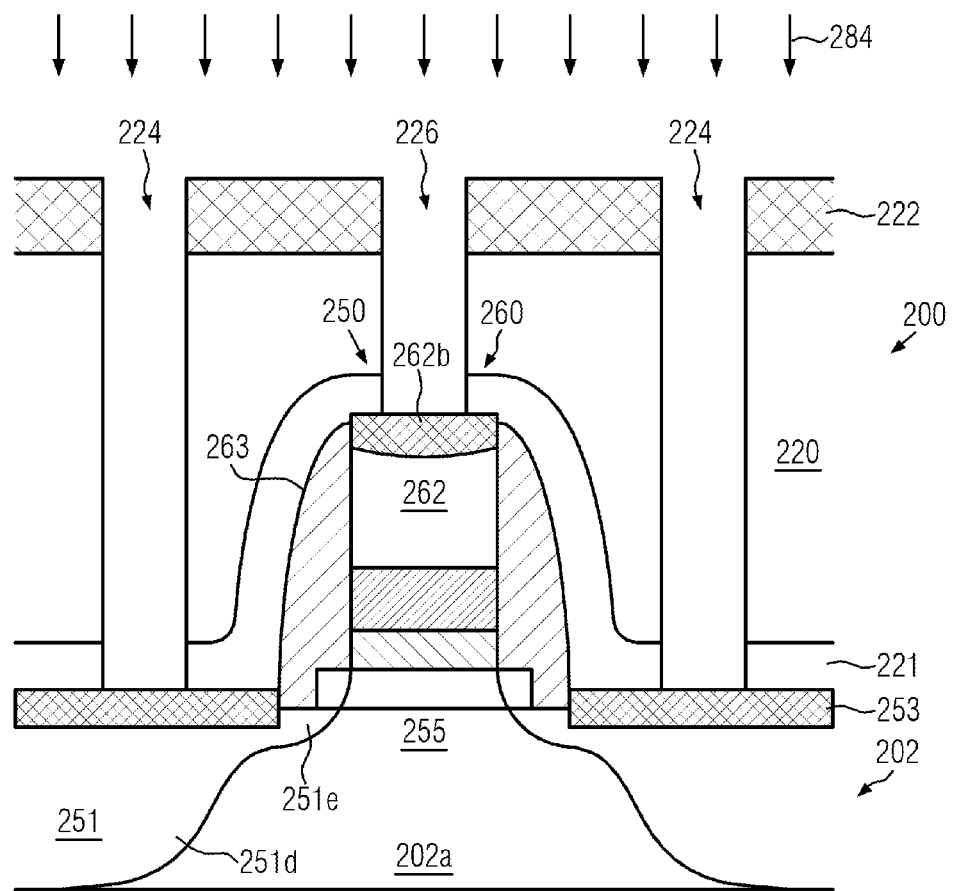

FIG. 2g shows a stage of the fabrication process flow subsequent to that represented in FIG. 2f. An interlayer dielectric layer 220 has been deposited onto the stressed material layer 221. An etch 284 is then applied, for example, through patterned mask 222, in order to form via openings 224 and 226. Openings 224 expose predetermined portions of the metal semiconductor layer 253 contacting the source and drain regions 251. On the other hand, via opening 226 exposes predetermined portions of the metal semiconductor layer 262b contacting the gate electrode material 262.

Since the metal silicide layer 253 is continuous and does not have any holes or cut-out portions, etch 284 stops at the upper surface of the metal silicide layer 253, as required. In this manner, the formation of contact punch throughs extending inside the source and drain regions 251 of the transistor 250 is prevented from occurring.

Finally, via openings 224 and 226 may be filled with a metal, for example tungsten, so as to form electrical contacts to the source and drain regions 251 and to the gate electrode material 262 of the transistor 250.

Thus, according to the first embodiment of the present invention, a method of fabricating a P-channel FET is proposed, wherein the portions thereof comprising SiGe and, particularly, a channel SiGe layer, are completely separated from a refractory metal layer deposited on the semiconductor structure. In particular, the portion of the refractory metal layer deposited on top of the source and drain regions is completely separate from any SiGe structure portion and only forms an interface with silicon. Thus, upon silicidation of the refractory metal layer, no germanium is included in the metal silicide layer adjacent to the source and drain regions of the transistor. This prevents the metal silicide layer contacting the source and drain regions from agglomerating into isolated clusters as a result of heating processes performed at a high temperature after the silicidation stage.

FIGS. 3a-3d schematically show a second embodiment of the method according to the present invention, wherein a P-channel FET is produced according to a conventional fabrication process flow and predetermined portions of a channel semiconductor alloy layer are removed after performing an activation heating step at the end of the conventional fabrication process.

Figure 3A:
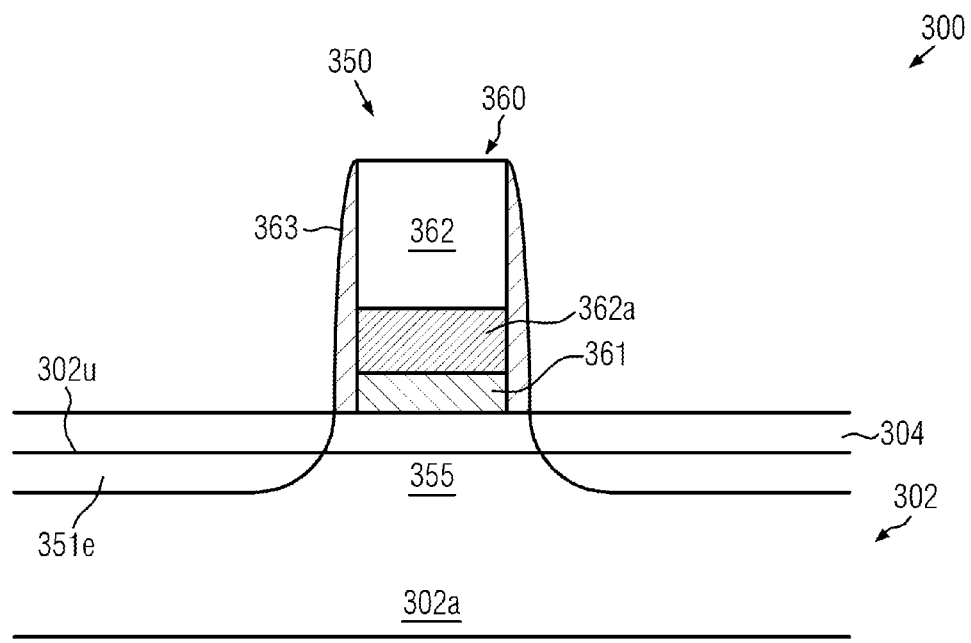
FIGS. 3a-3d schematically illustrate cross-sectional views of a semiconductor structure during subsequent manufacturing stages according to a further embodiment of the method according to the present invention.

FIG. 3a shows a semiconductor structure 300 including a P-channel FET 350 during a fabrication stage corresponding to that represented in FIG. 2b.

A semiconductor alloy layer 304, preferably comprising SiGe, has been formed on the upper surface 302u of a semiconductor layer 302. The semiconductor alloy layer 304 may have a thickness in the range of about 5-50 nm and, preferably, in the range of about 6-10 nm. The semiconductor layer 302, preferably crystalline silicon, is provided with at least an active region 302a, in and on top of which the transistor 350 is to be formed. A gate electrode structure 360 has then been formed on semiconductor alloy layer 304. Gate electrode structure 360 comprises a gate electrode material 362, an insulating layer 361 and, optionally, a gate metal layer 362a. The gate electrode structure 360 is then limited by spacers 363. Extension regions 351e of the source and drain regions of the transistor 350 may then be formed as described above.

Figure 3B:
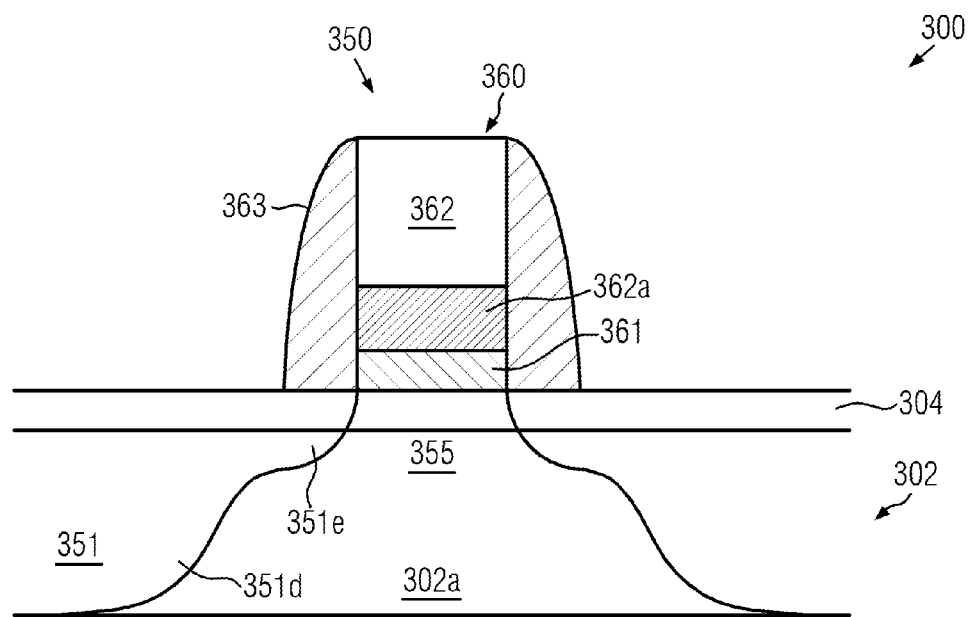

Subsequently, as shown in FIG. 3b, spacers 363 may be broadened and formation of source and drain regions 351 in the active region 302a may be completed by forming deep regions 351d of the source and drain regions 351. Thereafter, an annealing step may be performed so as to activate the doping species implanted in source and drain regions 351, as known in the art and described above with reference to FIG. 2d.

Figure 3C:
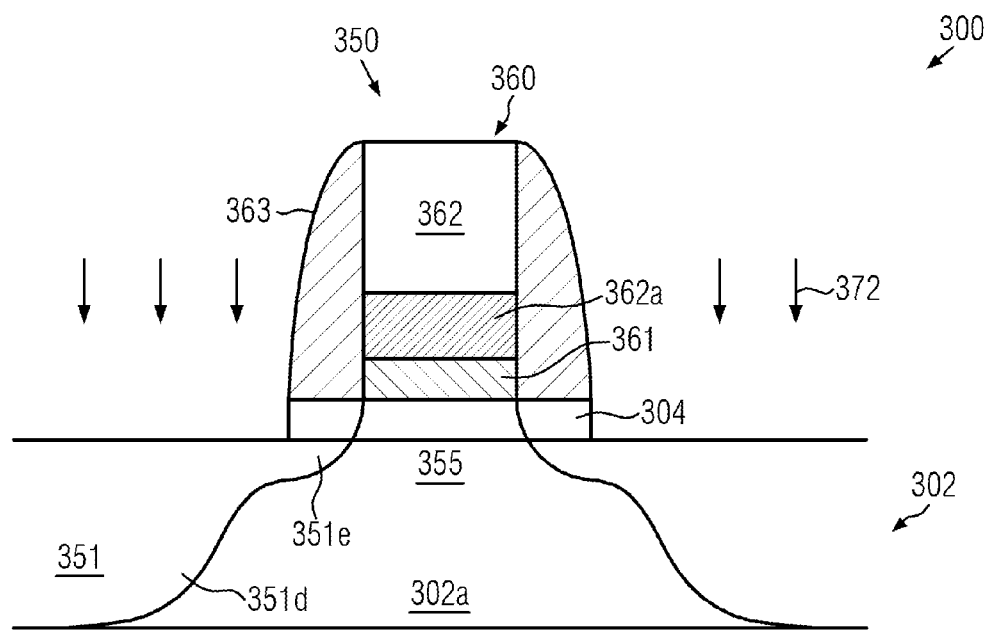

After the activation anneal, the method according to the embodiment being described proposes to perform an etch 372, as shown in FIG. 3c. Etch 372 may be performed in the same manner and has an analogous purpose to etch 272 shown in and discussed with reference to FIG. 2c. Thus etch 372 is preferably isotropic and may be performed, for example, by means of RIE. Etch 372 is performed so that the thickness of the removed surface layer of the semiconductor structure 300 is approximately equal to the thickness of the semiconductor alloy layer 304. Thus, for example, the parameters of etch 372 may be adjusted so that a surface layer of a thickness between about 6-10 nm is removed from semiconductor structure 300. Thus, semiconductor alloy layer 304 is removed by etch 372 in correspondence to all its portions not lying under and screened by the gate electrode 360, whereas semiconductor layer 302 is substantially unaffected by etch 372, except at most for a thin surface layer not thicker than about 1 nm. In particular, all portions of the semiconductor alloy layer 304 lying on top of the source and drain regions 351 are removed by etch 372.

Also, according to this second embodiment, etch 372 exposes a surface of semiconductor layer 302 which is the same as or extremely close to the original upper surface 302u onto which semiconductor alloy layer 304 has been deposited. By stating that the exposed surface is "extremely close" to the original upper surface of the semiconductor layer, it is to be understood that, in this and in the previous embodiment, etch 372 cannot remove a superficial layer of semiconductor layer 302 thicker than about 1 nm, respectively.

After applying etch 372, a refractory metal layer (not shown) is deposited onto the exposed surface of the semiconductor structure 300, as shown, for example, in FIG. 1b. The refractory metal layer preferably comprises nickel.

Figure 3D:
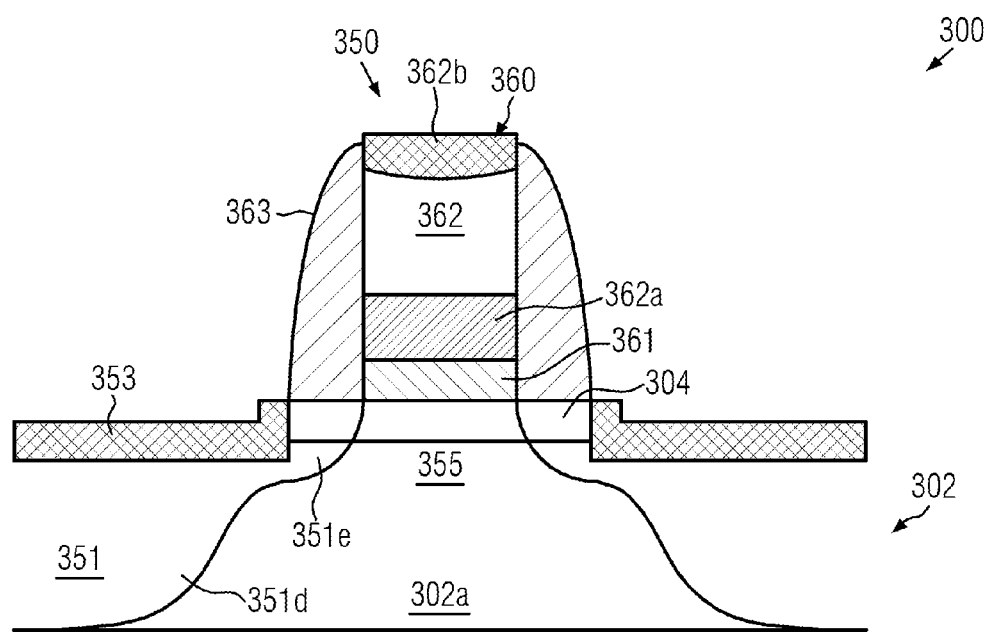

The silicidation step shown in FIG. 1b with reference number 180 and discussed with reference thereto is then applied so as to obtain the metal silicide layers 362b and 353 (see FIG. 3d). The metal silicide layer 353 contacting source and drain regions 351 forms a wide area interface with the semiconductor layer 302. Furthermore, the metal silicide layer 353 forms a small area interface with the side portions of the semiconductor alloy layer 304 exposed towards the outside.

In this manner, diffusion of germanium into the metal silicide layer 353 is limited to the limited area of the interface between the metal silicide layer 353 and the semiconductor alloy layer 304.

The fabrication process continues in an analogous manner as shown in FIGS. 1d-1e and 2f-2g. In particular, a stressed material layer is deposited onto the semiconductor structure 300 and a UV curing process is then applied as shown in FIGS. 1d and 2f. One should appreciate that the metal silicide layer 353 does not agglomerate into clusters as a result of the deposition of the stressed material layer and/or of the application of the UV cure. Subsequently, an interlayer dielectric layer is deposited onto the semiconductor structure 300 and an etch is performed in order to open via openings exposing predetermined portions of metal silicide layers 353 and 362b. Finally, the openings may be filled with a metal, for example tungsten, so as to form electrical contacts to the source and drain regions and to the gate electrode material of the transistor 350.

Thus, the present invention provides a method of fabricating a P-channel FET, wherein SiGe is completely removed from the source and drain regions of the P-channel FET. In this manner, a metal silicide layer adjacent and contiguous to the semiconductor layer may be formed in correspondence to the source and drain regions. The metal silicide layer contacting the source and drain regions thus contains no germanium or a negligible concentration thereof, which makes it stable upon heating the semiconductor structure at high temperatures. As a consequence, the metal silicide layer on the source and drain regions does not agglomerate upon heating steps performed at a high temperature after silicidation.

The present invention is particularly advantageous in, although not limited to, the fabrication of P-channel FETs including a channel SiGe layer used for modulating the work function of the transistor. This is required, for example, with implementations using a gate-first high-k/metal gate procedure starting from the 32 nm technology. Furthermore, the present invention finds an advantageous application when fabricating P-channel FETs including a channel SiGe layer and no embedded SiGe in the active region at the ends of the channel regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor structure adapted to be formed as a P-channel FET, said method comprising:
    forming a semiconductor layer comprising at least one active region, said semiconductor layer comprising an upper surface;
    depositing a semiconductor alloy layer onto said upper surface of said semiconductor layer;
    forming a gate electrode structure onto said semiconductor alloy layer;
    forming source and drain extension regions in said at least one active region of said semiconductor layer;
    after forming said source and drain extension regions in said at least one active region of said semiconductor layer, removing one or more predetermined portions of said semiconductor alloy layer so as to expose one or more surface portions of said semiconductor layer; and
    forming a metal silicide layer having an interface with said semiconductor layer, said metal silicide layer being formed after removing said one or more predetermined portions of said semiconductor alloy layer.

2. The method of claim 1, wherein said semiconductor layer comprises silicon.

3. The method of claim 1, wherein said semiconductor alloy layer comprises a silicon/germanium alloy.

4. The method of claim 1, wherein said semiconductor alloy layer has a thickness in the range of about 6-10 nm.

5. The method of claim 1, wherein said one or more predetermined portions removed from said semiconductor alloy layer comprise one or more portions of said semiconductor alloy layer which do not lie below said gate structure.

6. The method of claim 1, wherein said step of removing said one or more predetermined portions of said semiconductor alloy layer comprises performing an isotropic etch.

7. The method of claim 1, further comprising forming deep source and drain regions after said step of removing said one or more predetermined portions of said semiconductor alloy layer and before depositing a refractory layer, said deep source and drain regions extending below said respective source and drain extension regions.

8. The method of claim 1, further comprising depositing a refractory metal layer onto said one or more exposed surface portions of said semiconductor layer, said step of depositing said refractory metal layer being performed after said step of removing said one or more predetermined portions of said semiconductor alloy layer and before said step of forming said metal silicide layer.

9. The method of claim 1, further comprising depositing a stressed material layer onto the exposed surface of said semiconductor structure, said deposition of said stressed material layer being performed after said step of forming said metal silicide layer.

10. The method of claim 9, wherein said step of depositing a stressed material layer is followed by a UV cure.

11. The method of claim 1, further comprising depositing a dielectric material layer onto the exposed surface of said semiconductor structure, said deposition of said dielectric material layer being performed after said step of forming said metal silicide layer.

12. The method of claim 1, further comprising forming a plurality of via openings exposing predetermined portions of said metal silicide layer.

13. The method of claim 12, further comprising filling said openings of said plurality of openings with one or more electrically conductive materials.

14. A method of forming a semiconductor structure adapted to be formed as a P-channel FET, said method comprising:
    forming a semiconductor layer comprising at least one active region, said semiconductor layer comprising an upper surface;
    depositing a semiconductor alloy layer onto said upper surface of said semiconductor layer;
    forming a gate electrode structure onto said semiconductor alloy layer;
    forming source and drain extension regions in said at least one active region of said semiconductor layer;
    removing one or more predetermined portions of said semiconductor alloy layer so as to expose one or more surface portions of said semiconductor layer, said one or more predetermined removed portions of said semiconductor alloy layer comprising all portions of said semiconductor alloy layer lying directly on said source and drain extension regions; and
    forming a metal silicide layer having an interface with said semiconductor layer, said metal silicide layer being formed after removing said one or more predetermined portions of said semiconductor alloy layer.

15. The method of claim 14, wherein said semiconductor layer comprises silicon.

16. The method of claim 14, wherein said semiconductor alloy layer comprises a silicon/germanium alloy.

17. The method of claim 14, wherein said semiconductor alloy layer has a thickness in the range of about 6-10 nm.

18. The method of claim 14, wherein said step of removing said one or more predetermined portions of said semiconductor alloy layer comprises performing an isotropic etch.

19. The method of claim 14, further comprising forming deep source and drain regions after said step of removing said one or more predetermined portions of said semiconductor alloy layer, said deep source and drain regions extending below said respective source and drain extension regions.

* * * * *